(12) United States Patent
Kim

(10) Patent No.: US 7,242,607 B2
(45) Date of Patent: Jul. 10, 2007

(54) DIODE-BASED MEMORY INCLUDING FLOATING-PLATE CAPACITOR AND ITS APPLICATIONS

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 11/307,318

(22) Filed: Feb. 1, 2006

(65) Prior Publication Data

US 2007/0133258 A1  Jun. 14, 2007

Related U.S. Application Data

(63) Continuation of application No. 11/306,756, filed on Jan. 10, 2006, and a continuation of application No. 11/306,161, filed on Dec. 19, 2005, and a continuation of application No. 11/164,919, filed on Dec. 11, 2005, now Pat. No. 7,196,926, and a continuation of application No. 11/164,872, filed on Dec. 8, 2005, now Pat. No. 7,209,384.

(51) Int. Cl.
*G11C 11/24* (2006.01)

(52) U.S. Cl. ............... 365/149; 365/175; 365/155; 365/105; 365/177

(58) Field of Classification Search ........... 365/149
See application file for complete search history.

(56) References Cited

U.S. PATENT DOCUMENTS

| | | | |
|---|---|---|---|
| 6,104,045 A | 8/2000 | Forbes et al. |
| 6,229,161 B1 | 5/2001 | Nemati et al. |
| 6,331,947 B1 * | 12/2001 | Widdershoven et al. ............ 365/185.08 |
| 6,492,662 B2 | 12/2002 | Hsu et al. |
| 6,773,968 B1 | 8/2004 | Forbes et al. |
| 6,838,723 B2 | 1/2005 | Forbes |
| 6,943,083 B2 | 9/2005 | Forbes |
| 6,967,358 B2 | 11/2005 | Nemati et al. |
| 7,078,739 B1 | 7/2006 | Nemati et al. |
| 2004/0041206 A1 * | 3/2004 | Bhattacharyya ............ 257/326 |

OTHER PUBLICATIONS

"A novel capacitor-less DRAM cell Thin Capacitively-Coupled Thyristor (TCCT)", 2005 IEEE Electron Devices Meeting (IEDM) Tech. Dig. pp. 311.
WO/2005/114742 Silicon on Insulator Read-Write Non-Volatile . . . .

* cited by examiner

*Primary Examiner*—Thong Q. Le

(57) ABSTRACT

Floating plate memory includes a diode as an access device, wherein the diode has four terminals, the first terminal serves as a word line, the second terminal serves as a storage node, the third terminal is floating, and the fourth terminal serves as a bit line; a floating plate capacitor serves as a storage device, wherein the capacitor includes three plates, the first plate is connected to the storage node, the second plate is floating and the third plate is connected to a plate line; when write, the diode determines whether the storage node is coupled or not by raising the plate line; when read, the diode serves as a sense amplifier to detect the storage node voltage whether it is forward bias or not, and the diode sends binary results to a data latch including a current mirror; and the memory is formed on the bulk and SOI wafer.

14 Claims, 6 Drawing Sheets

Shockley Diode
(Hold "on/off" state)

Flash Memory

Read 1

Read 0

Truth Table. 1 — T20

| sdata | nsdata | cdata | ncdata | Match line | Result |
|---|---|---|---|---|---|
| 0 | 0 | x | x | High | Match |
| 0 | 1 | 1 | 0 | Low | Mis-match |
| 0 | 1 | 0 | 1 | High | Match |
| 1 | 0 | 1 | 0 | High | Match |
| 1 | 0 | 0 | 1 | Low | Mis-match |

T21  T22  T23  T24  T25  T26

T31, T32, T33, T34, T35

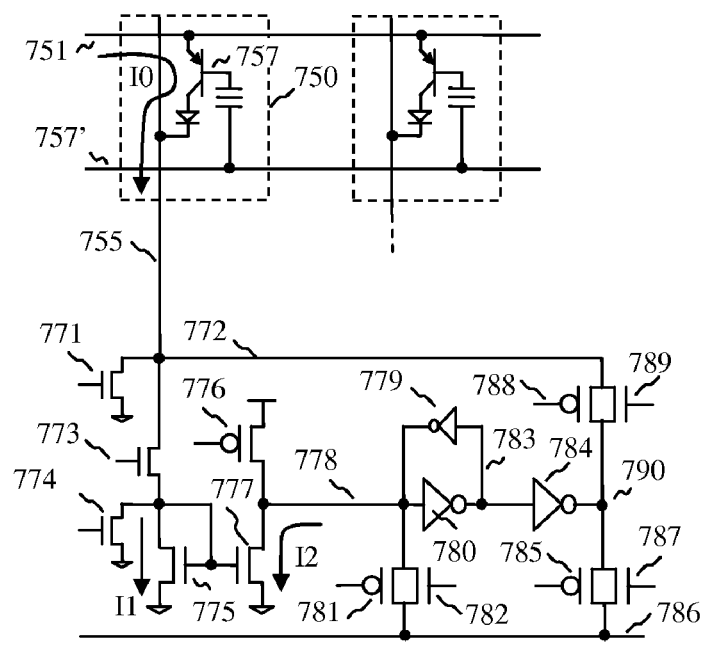
FIG. 7
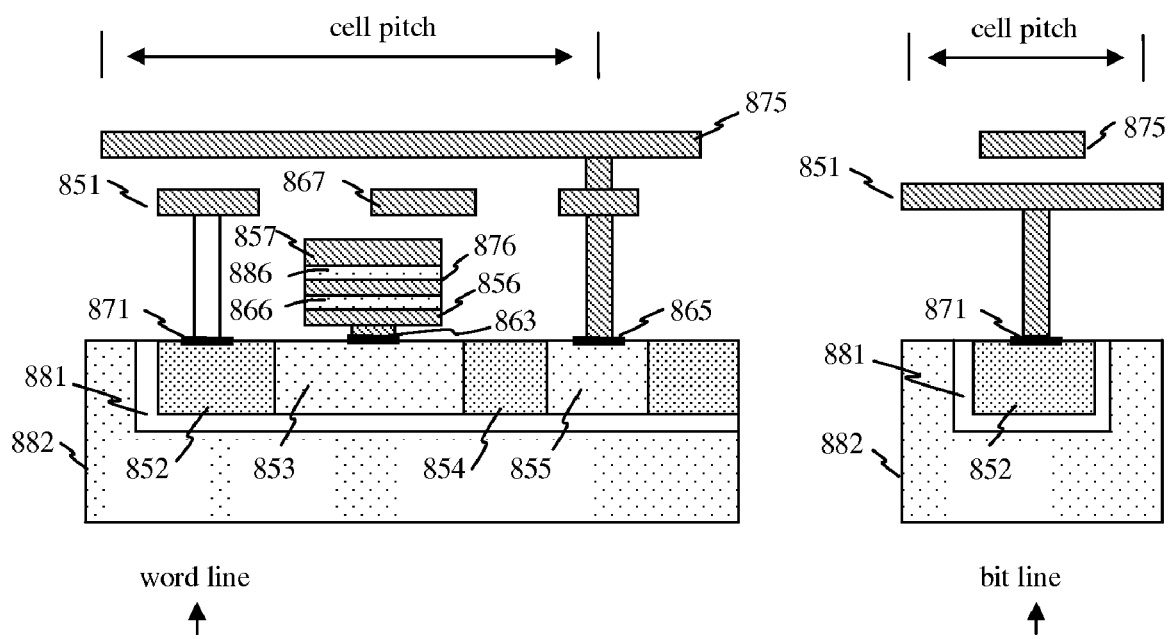
FIG. 8A
FIG. 8B

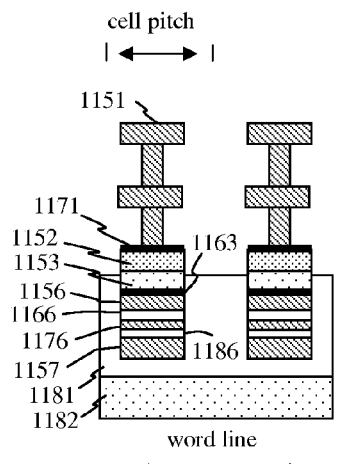
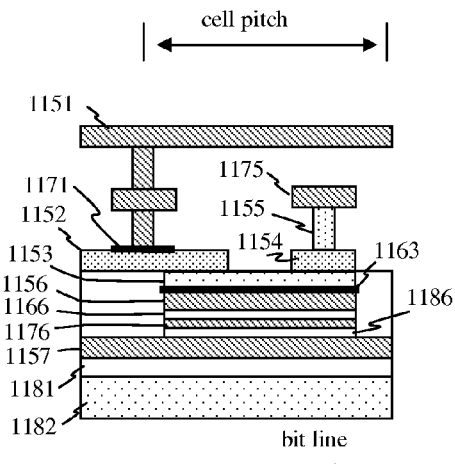
FIG. 11A
FIG. 11B
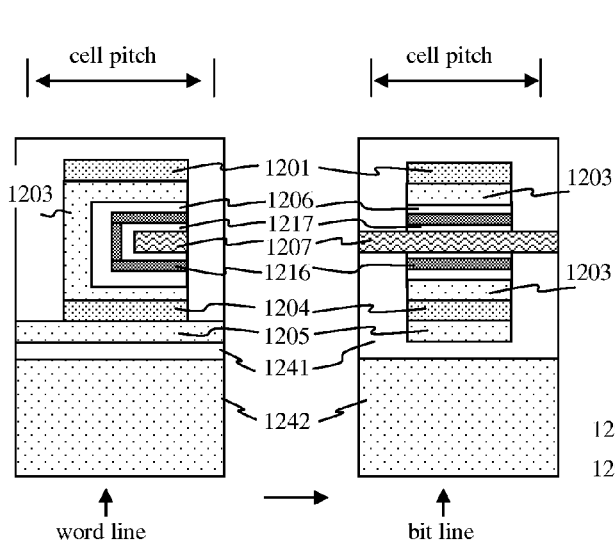
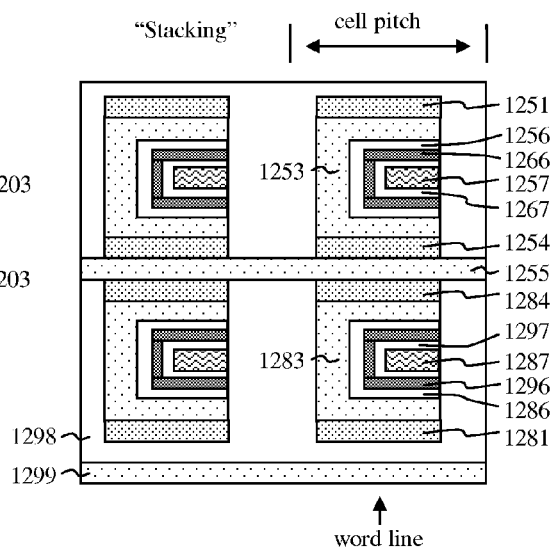
FIG. 12A  FIG. 12B
FIG. 12C

DIODE-BASED MEMORY INCLUDING FLOATING-PLATE CAPACITOR AND ITS APPLICATIONS

CROSS REFERENCE TO RELATED APPLICATION

Continuation of application Ser. No. 11/164,872 which is filed on Dec. 8, 2005, application Ser. No. 11/164,919 which is filed on Dec. 11, 2005 now U.S. Pat. No. 7,196,926, application Ser. No. 11/306,161 which is filed on Dec. 19, 2005, application Ser. No. 11/306,756 which is filed on Jan. 10, 2006.

FIELD OF THE INVENTION

The present invention relates generally to integrated circuits, in particular to RAM (Random Access Memory) and its applications including single-port and content addressable memory.

BACKGROUND OF THE INVENTION

A p-n-p-n diode known as a Shockley diode or a thyristor, is a solid-state semiconductor device similar to two-terminal p-n diode, with an extra terminal which is used to turn it on. Once turned on, diode (p-n-p-n diode or n-p-n-p diode) will remain on conducting state as long as there is a significant current flowing through it. If the current falls to zero, the device switches off. Diode has four layers, with each layer consisting of an alternately p-type or n-type material, for example p-n-p-n and n-p-n-p. The main terminals, labeled anode and cathode, are across the full four layers, and the control terminal, called the gate, is attached to one of the middle layers. The operation of a diode can be understood in terms of a pair of tightly coupled transistors, arranged to cause the self-latching action.

Diodes are mainly used where high currents and voltages are involved, and are often used to control alternating currents, where the change of polarity of the current causes the device to automatically switch off; referred to as 'zero cross operation'. The device can also be said to be in synchronous operation as, once the device is open, it conducts in phase with the voltage applied over its anode to cathode junction. This is not to be confused with symmetrical operation, as the output is unidirectional, flowing only from anode to cathode, and so is asymmetrical in nature.

These properties are used control the desired load regulation by adjusting the frequency of the trigger signal at the gate. The load regulation possible is broad as semiconductor based devices are capable of switching at extremely high speeds over extremely large numbers of switching cycles.

In FIG. 1A, the schematic of diode is illustrated. It consists of four terminals, such that the anode 111 is connected to power supply or regulating node, the base 112 of p-n-p transistor 115 serves as the collector 112 of n-p-n transistor 114, the collector 113 of p-n-p transistor 115 serves as the base of n-p-n transistor 114 which is controlled by the voltage controller 116. In order to turn on diode and hold the state of turn-on, the voltage controller should raise the voltage from ground level to VF (forward bias, 0.6v~0.8v for silicon). And the voltage controller 116 should supply the current 117, referred as the base current, which current depends on the characteristic of transistor 114 and 115. Once the base current 117 establishes the forward bias (VF), the collector 112 of n-p-n transistor 114 holds the current path 119 from the base of p-n-p transistor 115. After then, p-n-p transistor 115 is turned on because the base 112 has forward bias from the emitter 111. This makes the current path 118 which can keep the turn-on state. This is the holding state as long as the base has not so much leakage to drive the base voltage under forward bias (VF) even though the voltage controller 116 is open. To turn off diode, the voltage controller 116 should lower the voltage of the base of n-p-n transistor 114 under forward bias. To do so, the voltage controller 116 should (negatively) flow more current than the current path 118.

Diode can hold the states of turn-on or turn-off, but it has very high holding current to store 'on' state. There are prior arts to apply diode to a memory devices, such as, "High density planar SRAM cell using bipolar latch-up and gated diode breakdown", U.S. Pat. Ser. No. 6,104,045, and "Thyristor-type memory device" U.S. Pat. Ser. No. 6,967,358 and "Semiconductor capacitively-coupled negative differential resistance device and its applications in high-density high-speed memories and in power switches", U.S. Pat. No. 6,229,161. These prior arts require very high holding current and multiple internal voltage generators, in order to use a diode itself as a holding device which becomes a memory cell. And there is another report, "A novel capacitor-less DRAM cell Thin Capacitively-Coupled Thyristor (TCCT)", 2005 IEEE Electron Devices Meeting (IEDM) Tech. Dig. pp. 311. This approach requires very deep negative voltage in order to write data because the inversion layer of the gate is attached to the drain/source region (or emitter/collector), the gate can swing only ground to deep negative voltage (−1.5V) to avoid the leakage path to the drain, which needs negative pump circuit or external negative voltage. High current consumption eventually raises operating temperature by "Joule heating", which produces more junction leakage and gate leakage. Consequently, the data stored in diode can be lost quickly by those leakages, which means that it is difficult to use diode itself as a memory device.

Another approach is that diode replaces the MOS access device as a switching element, not holding device. However diode can not easily replace the MOS device as an access device because it has unidirectional current control characteristic and internal feedback loop. Now the present invention devotes to replace MOS transistor with a diode as an access device and a control methodology has been invented to control the diode for memory operation. Diode can work for the memory devices as a switching element, not a storage element. Furthermore, diode can replace sense amplifier as well, such that diode output makes information "on" or "off" which is digital value. It gives us as many as advantages to design and fabricate it on the wafer.

Separately a capacitor is still required to store data as the conventional memories such as DRAM, but now there is no need of high capacitance to drive bit line directly. Instead, the capacitor drives only one of diode terminals which has very little capacitance, and the capacitor communicates to bit line (or data line) indirectly, while diode directly communicates to bit line. As a result, diode serves as a sense amplifier to detect whether the storage node voltage is forward bias. This is different control method from the conventional DRAM, where the gate of MOS transistor is connected to word line and turns on and off, but the load of gate is only gate capacitance and routing capacitance, while the storage capacitor drives the very heavy bit line directly, which means that word line loading is very light. Conversely, using diode as an access device gives bit line loading to word line through diode, which makes word line loading very heavy, but it is controllable to design with strong driver or segmentation for word line. Even though word line loading is high, it is desirable to configure a memory array because word line driver is stronger than the storage capacitor. In the conventional DRAM, the weak storage capacitor directly drives bit line, which needs time to redistribute charge from the capacitor to bit line. The stored charge was lost during read cycle by the charge redistribution, which is referred as destructive read. Memory read cycle was very slow because each read cycle requires additional restore procedure.

Furthermore, the word line should be higher level than that of bit line to reduce threshold voltage drop by the access NMOS transistor. In case of PMOS access transistor, word line should be negative during read and restore. Those consume high switching current and pumping current. And MOS access transistor has subthreshold leakage current which is tricky and hard to reduce. In order to reduce subthreshold leakage current, the body of the MOS transistor is applied negative voltage for NMOS transistor, but the internal negative voltage generator consumes current and needs to be adjusted for the optimum voltage level for the use. And one more undesirable effect is the parasitic bipolar transistor in the bottom side of the MOS transistor which should be suppressed by applying the negative voltage to the body. The slight forward bias can remove the stored charge to the body.

Applying a diode as an access device, memory array design has a lot of freedom escaping from the MOS device. Additionally, the capacitor can be reduced, and any of capacitor can be used for storing data. Depending on the capacitor material, the retention time and the write time are different. For example, DRAM uses ordinary dielectric capacitor, such as silicon dioxide, silicon nitride, $Ta_2O_5$, $TiO_2$, $Al_2O_3$, TiN/HfO$_2$/TiN(TIT), and Ru/Insulator/TiN (RIT), which can store data in the range of 300 ms to 1 sec. It is called volatile memory. Alternatively, ferroelectric capacitor can be used as a storage capacitor, such as lead zirconate titanate (PZT), lead lanthanum zirconium titanate (PLZT), barium strontium titanate (BST), and strontium bismuth tantalate (SBT). As shown in the prior art, "Ferroelectric Random-Access Memory", U.S. Pat. No. 5,600,587. In the present invention, ferroelectric capacitor can be used as a volatile memory because the stored charges are gradually discharged after the electric field is off. Moreover read operation is different from FRAM (Ferroelectric Random Access Memory), such that plate line is not moving when read in the present invention, while plate line moves in FRAM operation in order to measure the polarized charges in the capacitor. Thus the memory operation is still volatile mode, but retention time would be increased as long as high dielectric constant material is used.

In the flash memory as the prior art, the floating gate is used to store data by the tunneling effect. Depending on the stored charge in the floating gate, the MOS field effect transistor has different threshold voltage. As a result, it flows more current or less current. Then sense amplifier can detect the current or voltage level. In FIG. 1B, the conventional flash memory is depicted. The MOS transistor 123 includes floating gate, gate 121 controls the floating gate and switching drain 125 (bit line) to source 122 (ground line). The MOS transistor body 124 in FIG. 1B is connected to control line 126 which is used to erase and program.

In the present invention, the floating gate MOS transistor is not used to store data. However which gives a hint to use floating plate capacitor. This means that the storage element has a series capacitor. One of two capacitors can be broken and shorted, but the memory cell still works with one capacitor, because the storage capacitor drives only the base of the diode which has very little capacitance. In this manner, small storage capacitor can drives the diode, which diode drives heavily loaded bit line. Thus the memory yield is increased and the memory system is more reliable.

The conventional flash memory has a parasitic bipolar transistor where the base 124 in FIG. 1B controls the emitter/collector 122 and 125, where the base 124 serves as the body of the MOS transistor 123. During read and write cycle, the base 124 is at ground to prevent bipolar effect. The parasitic bipolar transistor is not wanted device in the conventional memories which is usually turned off by applying reverse bias voltage, but now adding one more terminal to the parasitic bipolar transistor in the conventional memory, a p-n-p-n diode (or n-p-n-p) can work for the next generation memory devices with good performance and simple structure.

SUMMARY OF THE INVENTION

In the present invention, diode-based memory including floating-plate capacitor is described. The memory cell includes a series capacitor and a p-n-p-n diode which combination is less complicated to fabricate, compared to fabricating complex MOS device. Replacing MOS access transistor with a diode as a switching device in the memory cell, there are as many as advantages to configure memory arrays, which can realize nondestructive read and simplify the memory cell structure with a few additional process steps. After storing data, word line turns off to cut the holding current, which reduces standby current dramatically. Diode need not be a high performance device nor have a high current gain, and diode can serve as a sense amplifier as well to detect the voltage of the storage node whether it is forward bias or not, then diode sends binary results to bit line. However the operation of diode is not as simple as that of MOS transistor because it has internal feedback loop and unidirectional current control in nature even though it has almost no parasitic effects, except punch-through which is simply avoided by selecting optimal base region. In the present invention, the circuit methodology has been invented to use a diode as an access device.

Additionally, a series capacitor includes the floating plate. There are many advantages of using a series capacitor as a storage element. One embodiment is that one of two capacitors is broken and shorted but the memory cell still works because the storage node drives only the base of diode which has little capacitance, thus single capacitor is enough to store data in DRAM application. As a result, the memory cell is not easily broken, which would increase memory yield.

Furthermore, any of capacitor can be used for storing data, such as ordinary dielectric capacitor and ferroelectric capacitor. Depending on the dielectric constant and leakage, the retention time is different.

Removing MOS device from the memory cell, the cell structure is simplified and new type of cell structures can be formed, which can reduce cell area dramatically with no performance degradation. And the present invention of memory can be implemented on the bulk and SOI wafer, which makes to integrate high density memory and control circuit on a chip.

The word line cuts off the holding current during standby. Thus the standby current is only oxide leakage in the memory cell, which realizes extremely low power consumption. The low power consumption suppresses junction leakage and capacitor oxide leakage. It is very helpful to store data for a long time in the storage node with low leakage, which can increase memory yield. Capacitor oxide leakage is minimized with low leakage material or thick oxide because the memory cell does not require high capacitance.

Various types of diode can be applied to form the memory cell, such as silicon including solid-state, amorphous and stretchable silicon, germanium, GaAs, SiGe, and metal semiconductor diode, as long as the reverse bias current is controllable.

The memory operation is very fast and stable. Diode output can be transferred to bit line quickly, because diode current is generally much higher than that of MOS transistor. The diode generates current with its whole junction area while MOS transistor generates current with inversion layer on the surface. And nondestructive read is realized, which need not restoring procedure and makes to reduce cycle time. The diode detects the storage node whether it is forward bias or not when the word line is asserted. Thus the diode serves as a sense amplifier which generates the current or not, and then the latch has a current mirror. The current mirror repeats the bit line current and latches the result, which realizes very fast latching operation which does not require waiting time. Write operation has a sequence to clear data, that is, to turn-on diode before writing, which makes storage node to have the same starting voltage when writing. Without this sequence, the stored level depends on the previous level which can be discharged after restored.

The usage of the memory cell can be easily expanded as single port memory, and content addressable memory because of the simplicity to fabricate, small cell area, low power consumption, high speed operation.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 7 illustrates an embodiment to configure an array and latch for the binary level application.

FIGS. 8A and 8B illustrate the cross sectional views of one embodiment for the present invention on the bulk wafer. 18A is shown from word line direction, and 18B is shown from bit line direction.

FIG. 11A and 11B illustrate the cross sectional views of one vertical embodiment for the present invention on the bulk or SOI wafer. 11A is shown from word line direction and 11B is shown from bit line direction.

FIGS. 12A and 12B illustrates the cross sectional views of vertical embodiment for the present invention on the bulk or SOI wafer. FIG. 12C illustrates the cross sectional views of vertical embodiment which stacks two cells for the present invention on the bulk or SOI wafer. It is shown from word line direction.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Detailed descriptions for the present invention are described as follows, which include the schematics, the timings and cross sectional views.

Figure 1A:
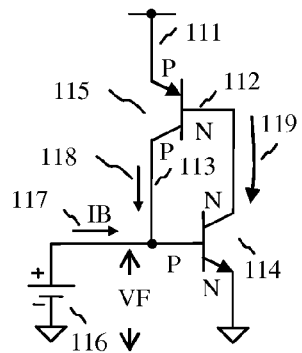
FIG. 1A illustrates a p-n-p-n diode as a prior art.
Figure 1B:
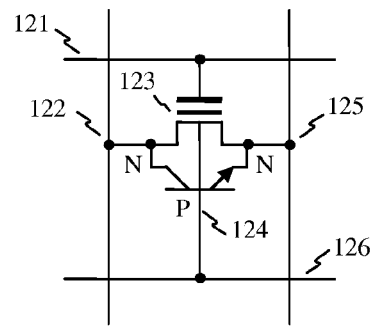
FIG. 1B depicts the schematic of the conventional flash memory as a prior art.
Figure 2A:
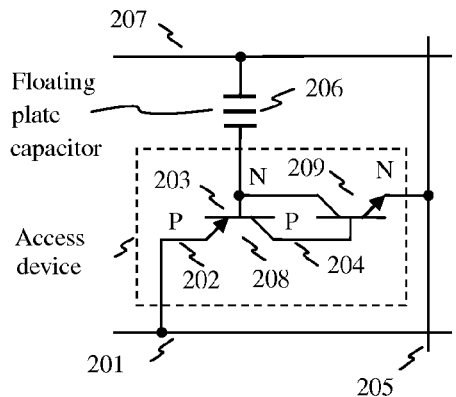
FIG. 2A depicts the schematic of the capacitor memory cell including a p-n-p-n diode and a floating-plate capacitor for the present invention.

In FIG. 2A, diode-based floating-plate capacitor memory is illustrated, as the present invention. A p-n-p-n diode replaces MOS access transistor, wherein the equivalent schematic of the p-n-p-n diode is illustrated as two bipolar transistors, p-n-p transistor 208 and n-p-n transistor 209. The emitter 202 of p-n-p 208 serves as word line 201, the base 203 of p-n-p 208 serves as storage node of the series capacitor 206, the collector 204 of p-n-p 208 serves as the base of n-p-n 209 the emitter of n-p-n 209 serves as bit line 205. There is feedback loop wherein the collector 203 of n-p-n 209 serves as the base 203 of p-n-p 208 which serves as the storage node as well, and the collector 204 of p-n-p 208 serves as the base 204 of n-p-n 209, which feedback loop makes us difficult to analyze it.

Now there is a circuit technique to simplify it. The base 203 of the storage node has much high capacitance to sustain the storage node, but the base 204 of the n-p-n 209 has very little parasitic capacitance. In this sense, the storage node of the series capacitor 206 which is the base 203 of p-n-p 208 can sustain the previous state for long time by the charges, but the base 204 of n-p-n 209 can not sustain the previous state because the connection between the base 204 and bit line 205 is forward bias and it has very little parasitic capacitance when bit line 205 is at ground level during pre-charge time, which forward bias makes the base 204 to lose the previous data quickly after word line 201 is deactivated to ground level for the pre-charge. This means that the collector 203 of n-p-n 209 has (almost) no current path through the emitter 205 of n-p-n 209 because the base 204 of n-p-n 209 (lost previous data) is at around ground level and turns off the n-p-n 209 when word line 201 is asserted to high level to read or write. Conversely, the storage capacitor 206 has enough charge to store the previous charge, because both the emitter 202 of p-n-p 208 and the collector 204 of p-n-p 208 are at near ground level and reverse bias, when word line moves to high level to read or write, the series capacitor 206 with the stored charge can control the base 203 of p-n-p 208 while n-p-n 209 is turned off. In this manner, the p-n-p 208 controls the collector 204 of the n-p-n 209. Now n-p-n 209 is dependent element with no current path through the collector 203 of n-p-n 209 to the emitter 205. This gives an idea to replace n-p-n 209 with a p-n diode. In the present invention, a model of diode device is provided to be applied for capacitor memory.

Figure 2B:
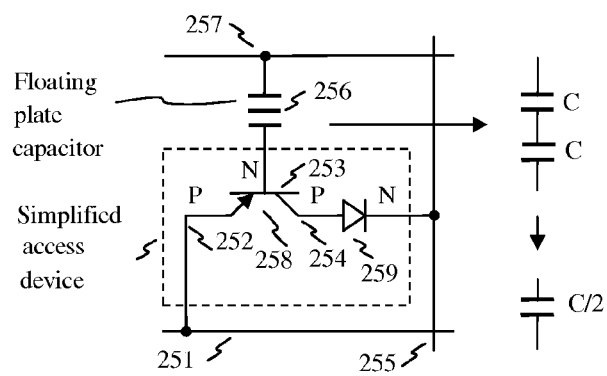
FIG. 2B illustrates the simplified schematic of diode-based floating-plate capacitor memory for the present invention.

In FIG. 2B, the simplified model of diode-based floating-plate capacitor memory is illustrated, wherein includes p-n-p bipolar transistor 258 and p-n diode 259. The emitter 252 of p-n-p 258 serves as word line 251, the base 253 of p-n-p 258 serves as a storage node of the capacitor 256, the collector 254 of p-n-p 258 serves as the anode of p-n diode 259, the cathode of p-n diode 259 serves as bit line 255. The p-n diode 259 effectively replaces n-p-n bipolar transistor, which p-n diode has important role to protect the unselected cell when bit line goes up to high level in order to write data "0". The p-n diode 259 is reverse bias and cuts off the current flow from bit line to the storage node. This simplified schematic is very useful to analyze as an access device of the memory cell. There is no feedback loop, and the current flow is only one direction from p-n-p bipolar transistor 258 to p-n diode 259. Furthermore, there are no tricky parasitic elements, while MOS access transistor has a parasitic bipolar transistor, the subthreshold leakage, hot carrier and more which are hidden. In the present invention, a series capacitor serves as a storage element, where total effective capacitance is reduced half, such that when each capacitor of the series capacitor has capacitance C but the effective capacitance of the storage element is half of each capacitor, C/2, as shown in FIG. 2B. However, the storage capacitor drives only the base of diode. In doing so, the memory operation is still same but retention time will be reduced. In order to increase retention time, each capacitor of the series capacitor can be increased. Also the capacitance can be increased by using high dielectric capacitor or increasing the area of the capacitor. And the series capacitor has leakage, thus the initial voltage of the floating plate is in the range between the supply voltage and the ground. As a result, the floating plate is not overstressed during the memory operation.

Figure 3:
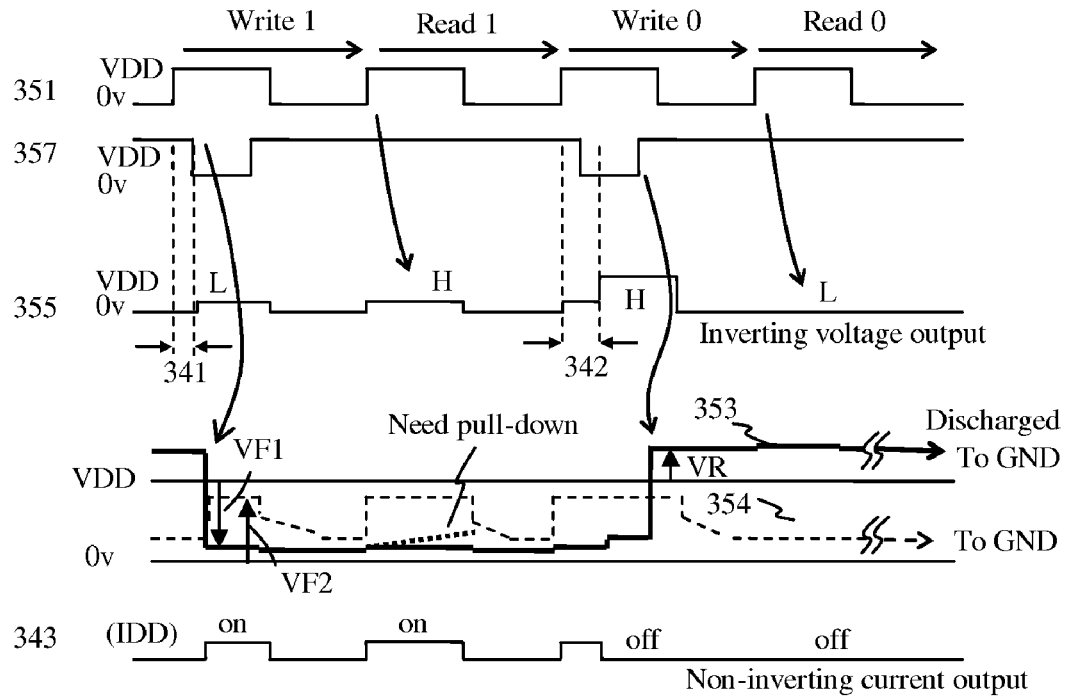
FIG. 3 illustrates write and read timing of diode-based floating-plate capacitor memory shown in FIG. 2B.

Referring now FIG. 3 in view of FIG. 2B, write and read timing are illustrated for the memory cell of the present invention. Word line 351 stays at ground level during standby, and moves to high level when writing or reading as shown in 341. Bit line 355 stays at ground level during standby. Then bit line 355 determines to store data "1" (turn-on) or data "0" (turn-off). To prepare writing data '1' is to move word line 351 to high level, and then to lower plate line 357 to ground level from the predetermined positive level in order to couple the storage node and to turn on diode, while bit line 355 keeps ground level but it will go up slightly by turning on diode. Then the storage node 353 becomes forward bias (VF1) toward word line which is at high level during write operation, and the floating node 354 which is the anode of diode 359 becomes forward bias (VF2) toward bit line which is at ground level to write data "1". It is raised by the p-n-p 358 which is turned on by lowering the plate line 357 or the stored charge 353 in the capacitor. The current path is set up from word line to bit line, after then the plate line 357 returns to high level to boost the storage node, but raising the plate line to high level can not boost the storage node because current flow is stronger than coupling. In doing so, the storage node 353 keeps forward bias and p-n-p-n diode is still turned-on. After the plate line returned to high level, word line 351 returns to ground level, and which cuts off the current path from word line to bit line during standby. As a result, there is no current path in the memory cell as shown in 343 in FIG. 3 during pre-charge (or standby), and the storage node keeps the potential that is reverse bias toward word line and weak forward bias toward floating node 354 which has ignorable leakage because the floating node 354 has very little charge. And the floating node will finally stay at ground level by the forward bias to bit line 355 which is at ground level.

After writing data "1", both word line and bit line are at around ground level, which makes the storage node reverse bias, but reverse bias leakage helps to keep data "1" because it makes strong forward bias toward word line for the storage node 353 when word line moves to high level to read, and the floating node 354 quickly loses its charge by the forward bias toward bit line which is at ground level, and it has very little parasitic capacitance as well, hence the n-p-n 359 is always turned-off during standby. When read, if the base 353 of the p-n-p transistor 358 is forward bias by the storage node 353, the p-n-p transistor 358 quickly raises the floating node 354. Consequently this makes to turn on all four terminals for the p-n-p-n diode and provides the current flow to bit line 355. Bit line will be pulled up by the current flow. In this manner, data "1" does not need refresh cycle or no concern about losing data "1" during standby. However, data "1" can be lost when reading data '1', word line moves up and pulls up bit line during word line is high, if there is no pull-down device to sustain the current flow of the cell, the current moves up bit line (floating) until it will reach the critical voltage to be turned it off. Not to lose data "1", NMOS pull-down should be connected to bit line 355 and keeps turn-on state during read cycle. It realizes non destructive read which removes restoring procedure and reduces cycle time.

Still referring FIG. 3 in view of FIG. 2B, in order to write data "0", a timing clears the state of diode before writing in order to have the same stored level regardless of previous stored level. This sequence needs to turn-on diode first as shown 342 in FIG. 3. After turn-on diode, bit line 355 goes up to high level and turns off diode because word line 351 and bit line 355 are at the same high level, no current can flow between two terminals, which makes the storage node floating with no current path and ready to be coupled by the plate line 357. After settling bit line, the plate line 357 returns to high level which makes the plate line 357 to couple to the storage node 353 to higher level than that of word line. Stored voltage of data "0" is determined by the swing voltage of the plate line and the capacitance of storage node where the parasitic capacitance of the storage node is negligible. The plate line 357 can have various swing level, such as, from ground to supply level, from ground to higher than supply level, from first predetermined level to second predetermined level. The storage node is coupled by the amount of the change of the plate line when the diode is turned off. After then, the storage node 353 will be discharged by the reverse bias leakage toward the adjacent nodes, which stay at ground level during standby or unselected when normal dielectric capacitor is used for the applications, but the ferroelectric capacitor can keep data longer. Capacitor oxide leakage would be ignorable in most applications with thick oxide or low leakage insulator. The floating node 354 will be turned-off after it quickly loses its charge by the forward bias toward bit line which is at ground level during standby, and it has very little parasitic capacitance and floating. The inverting voltage output is appeared in bit line 355 in FIG. 3 and non-inverting current output 343 is appeared in bit line. Refresh cycles are periodically asserted to sustain data "0" for DRAM application which operation includes to read voltage from the cell and restore inverting voltage data to the cell.

Figure 4A:
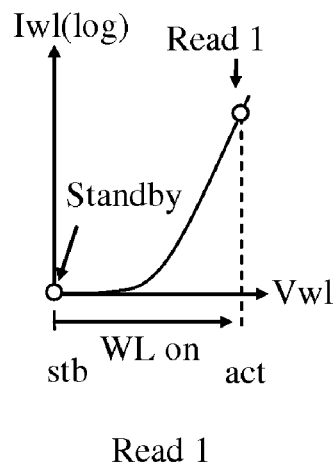
FIG. 4A illustrates I-V curve of the memory cell for read "1"
Figure 4B:
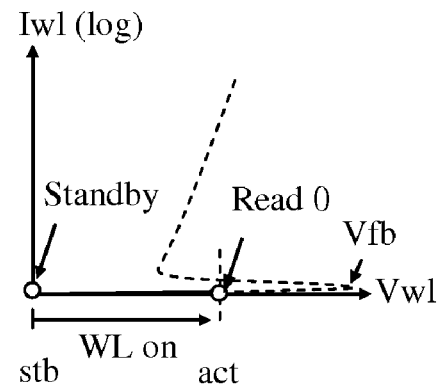
FIG. 4B illustrates I-V curve of the memory cell for read "0", for the present invention.

In FIGS. 4A and 4B, I-V curves are shown for the present invention. During standby, word line voltage (Vw1) is at ground level which does not make any current except oxide leakage. When reading data "1", word line moves to high level and makes current flow (Iw1) through bit line in FIG. 4A. This means that the storage node has forward bias toward word line. When reading data "0", the storage node stays at higher than word line level, which makes reverse bias for p-n-p transistor. Transistor p-n-p can not make current, and then the p-n diode can not make current either because the anode is at ground level. In FIG. 4B, the forward blocking voltage (Vfb) is illustrated when storing data "0", where forward blocking voltage is determined by the plate line swing level and storage capacitance. The forward blocking voltage is much higher than VDD.

Figures 5, 6:
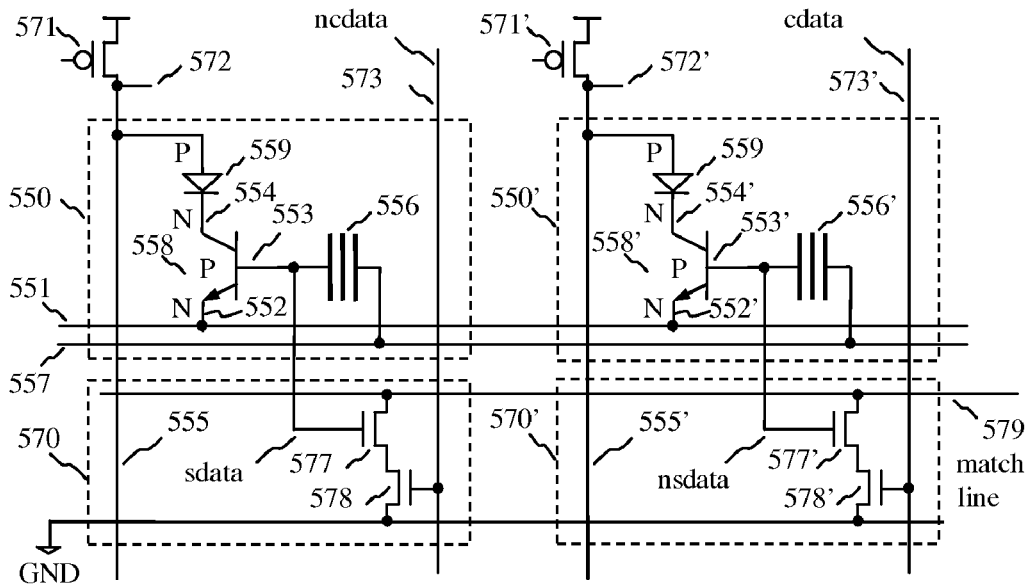
FIG. 5 illustrates an embodiment of CAM array based on the present invention, including n-p-n-p diode and compare circuit.
FIG. 6 provides a truth table summarizing the logical relationships among various signals in FIG. 5.

In FIG. 5, an example embodiment to implement content addressable memory is illustrated as the present invention, wherein the memory cell 500 and 550 use diode and capacitor. One advantage of using the diode-based memory is that the storage node can turn on or cut off the match line depending on the stored data, and read-write operation is the same as single port memory as explained above. In the example embodiment in FIG. 5, the memory cell uses n-p-n-p diode which equally works with reverse configuration wherein the signal polarities are reversed as well. When the stored data is "1", the storage node voltage is near VDD. Thus, the storage node turns on the match line, but the storage node cuts off the match line when the stored data is "0" because the storage node voltage is lower than ground level. In doing so, the match operation can be executed with the storage node voltage when the compare circuits are activated, while the memory cells are in standby mode. More detailed operations are explained as below.

There are two storage elements and two compare circuits in a CAM cell. In detail, a CAM is a storage device that is particularly suitable for matching functions because it can be instructed to compare a specific pattern of compared data with data stored in an associative CAM array. A CAM can include a number of data storage locations, each of which can be accessed by a corresponding address. Functionality of a CAM depends at least in part on whether the CAM includes binary or ternary CAM cells. Ternary CAM cells are mask-per-bit CAM cells that effectively store three states of information, namely a logic "1" state, a logic "0" state, and a don't care state for compare operations. Ternary CAM cells typically include a second memory cell that stores local mask data for the each ternary CAM cell. The local mask data masks the comparison result of the compared data with the data stored in the first memory cell such that, when the mask bit has a first predetermined value (a logic "0", for example) its compare operation will be masked so that the comparison result does not affect the match line. The ternary CAM cell offers more flexibility to the user to determine on an entry-per-entry basis which bits in a word will be masked during a compare operation. There are prior arts using DRAM, "DRAM based refresh-free ternary CAM", U.S. Pat. No. 6,331,961. And another prior art is shown using negative differential resistance device, "Semiconductor capacitively-coupled negative differential resistance device and its applications in high-density high-speed memories and in power switches", U.S. Pat. No. 6,229,161. But in this prior art, p-n-p-n diode itself (thyristor, or negative differential resistance device) can not be used as a storage element while the present invention uses the p-n-p-n diode as an access device, not storage device because holding current is very high during standby. And conventional SRAM-based CAM is used only for low-density applications. Thus in the present invention, the capacitor memory is used as a CAM application, which realizes high-density and high-speed CAM.

The memory cell 550 and 550' store data in storage capacitor 556 and 556'. The plate 557 couples to storage node 553 and 553' which serve as the bases of n-p-n transistor 558 and 558' respectively. The emitter 552 and 552' of n-p-n transistors are connected to word line 551. The collector 554 of n-p-n 558 and the collector 554' of n-p-n 558' serve as the cathodes of diode 559 and 559' respectively. The anode of diode 559 and 559' serve as bit line 555 and 555' respectively. PMOS pull-up 571 and 571' sustain the turn-on state of diode for realizing nondestructive read. Node 572 and 572' are bi-directional signal to read or write data. Compare circuit 570 and 570' share a match line 579 which includes series NMOS transistors, 577 and 579, 577' and 578' where NMOS compare circuit is faster and smaller than that of PMOS compare circuit, and n-p-n-p diode is used as memory cell.

In FIG. 6 in view of FIG. 5, a truth table T20 is shown summarizing the behavior of CAM cell in relation to signal states maintained by various elements within CAM cell in accordance with the present invention. First column T21 lists binary states of "0" and "1" that can be stored in storage node of the capacitor memory cell 550 in FIG. 5; second column T22 lists binary states of "0" and "1" that can be stored in storage node of the capacitor memory cell 550' in FIG. 5. Third column T23 lists the ternary states that can be maintained in one of the complement compare data lines, namely cdata which is the signal 573' in FIG. 5. Fourth column T24 lists the ternary states that can be maintained in the other complement compare data line, namely ncdata which is the signal 573 in FIG. 5. Fifth column T25 lists "high" and "low" as the two available voltage levels for match line 579. Finally, sixth column T26 lists "match" and "mismatch" as the two possible results for comparing states of ncdata line 573 and cdata line 573' with the states of CAM cell.

Continuing with FIG. 6 in view of FIG. 5, row T31 indicates masked case where sdata and nsdata are "0", which makes match line to stay the pre-charge level, regardless of the compare data because sdata and nsdata turn off MOS transistor 577 and 577', rows T32-T33 both indicate that "0" state of CAM cell is represented by "0" of capacitor memory cell 550, and "1" of capacitor memory cell 550'. In row T32, because state "1" of cdata line 573' does not match state "0" of CAM cell, match line 579 is driven "low" to indicate a mismatch of the data key and the stored value (state "0") of CAM cell. In row T33, because state "0" of cdata line 573' matches state "0" of CAM cell, match line 579 is driven "high to indicate a partial match of the compared and the stored value (state "0") of CAM.

Continuing still with FIG. 6 in view of FIG. 5, rows T34-T35 both indicate that "1" state of CAM cell is represented by "1" of capacitor memory cell 550 and "0" of capacitor cell 550'. In row T34, because state "1" of cdata line 573' matches state "1" of CAM cell, match line 579 is driven "high to indicate a partial match of the compared and the stored value (state "1") of CAM cell. In row T35, because state "0" of cdata line 573' does not match state "1" of CAM cell, match line 579 is driven "low" to indicate a mismatch of the compared and the stored value (state "1") of CAM cell.

In FIG. 7, read path including data latch is illustrated as the present invention, wherein the memory cell 750 includes p-n-p-n diode and series capacitor. When word line 751 is asserted to VDD, the diode is turned on if the storage node 753 is at VDD-VF which is the forward bias toward VDD. After the diode is on and the transistor 773 is on, the NMOS pull-down 775 flows current and sustain turn-on state through bit line 755 where plate line 757 is not changed. Before word line is asserted, the transistor 771 and 774 are turned off which transistors were turned-on during precharge only. Now the current mirror 777 will flow current the same amount of the diode flowed and it will change the pre-charged node 778 from high level to ground level because the node 778 was set by the transistor 776 during pre-charge time. The inverter 779 will resist to changing but the size is so small and then finally the node 778 will be changed to ground. After changing to ground, the state will be sustained by the feedback loop of the two inverters, 779 and 780. And the driver 784 can output the result to data bus 786, ground level through the node 790 when the transmission gate 785 and 787 are turned on. When the stored data is "0", the latch will keep output high level when the storage node 753 is at higher than VDD, because the diode will not be turned on and does not flow current. In this manner, the data latch includes pull-down transistor and current mirror, which realizes to latch the data from the memory cell with repeating the diode current. The data latch circuit does not require reference bit line. In contrast, the conventional sense amplifier requires reference bit line and needs waiting time until bit line is fully discharged in order to avoid sensing error. For write operation, the transmission gate 781 and 782, 788 and 789, are turned on. For refresh operation in case of DRAM application, the transmission gate 788 and 789 will be turned on but the other transmission gates are turned off.

Methods of Fabrication

Replacing MOS access transistor with a diode access device, the memory cell needs only a p-n-p-n diode (or n-p-n-p diode) and a capacitor storage element, which realize various types of memory cell structure, in order to fabricate on the bulk or SOI (Silicon-on-Insulator) wafer. The steps in the process flow should be compatible with the current CMOS manufacturing environment, which are reported as the prior arts, such as U.S. Pat. Nos. 6,104,045, 6,229,161, 6,940,761, 6,943,083, and 7,042,027. In this respect, there is no need of describing too much detailed process flow to form the memory cell, such as width, length, thickness, temperature, forming method or any other material related data. Instead of describing those details, the present invention focuses on illustrating the new memory cell structures which are practical and mass producible.

FIGS. 8A and 8B outlines one embodiment of a fabrication technique for the present invention, the memory cell is formed inside of a trench area on the bulk where word line 851 is connected to p-type region 852 through the ohmic contact region 871 which can reduce contact resistance, p-type region 852 is attached to n-type region 853 which is connected to the first plate of the capacitor 856 through the conduction layer 863, the series capacitor including the first insulator 866, the floating plate 876 and the second insulator 886, which insulators can be single layer or multilayer including barrier layer and dielectric material wherein low-k, high-k and ferroelectric material can be used. The third plate 857 of capacitor is connected to the plate line 867 outside of memory array (not shown) in order to reduce resistance because the third plate 857 drives multiple capacitors which increases capacitive loading to the third plate. And n-type region 853 is attached to p-type region 854, p-type region 854 is attached to n-type region 855, n-type region 855 is attached to bit line 875 through contact region 865 and other conduction layers. The memory cell is isolated from the well region 882 by the isolation layer 881. FIG. 8B shows the bit line direction of the memory cell, where the cell is formed inside of trench area adding isolation layer 881 on the bulk.

This configuration removes complicated MOS device from the memory cell, as a result, the memory cell has a series capacitor and a diode, which is simple to fabricate and analyze as long as the reverse bias leakage and the insulator leakage are controllable, but there is one more leakage path, so-called back channel effect in the planar p-n-p-n structure of wafer shown in FIG. 8A. Related references are disclosed, Chen et al, "Characterization of back-channel subthreshold conduction of walled SOI devices", IEEE Transactions on electron Devices, Vol. 38, No. 12, pp 2722, Dec. 1991, and Shin et al, "Leakage current models of thin film silicon-on-insulator devices", Applied Physics Letters, Vol. 72, No. 10, Mar. 1998. The parasitic NMOS transistor wherein the source/drain is n-type region 853, the body is p-type region 854, and the other source/drain is n-type region 855, and the well region 882 serves as the gate. However, in the present invention, the insulator 881 between the diode and the substrate is enough thick to remove back channel effect because the insulator 881 is grown only for the memory cell while the thin gate oxide will be grown only for MOS transistor (not shown). In doing so, back channel effect is avoided.

Figure 9A:
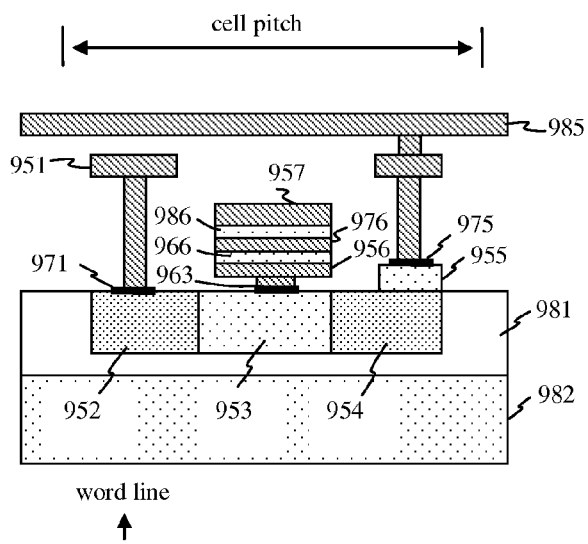
FIGS. 9A and 9B illustrate the cross sectional views of one vertical embodiment for the present invention on the SOI wafer. 9A is shown from word line direction, and 9B is shown from bit line direction.
Figure 9B:
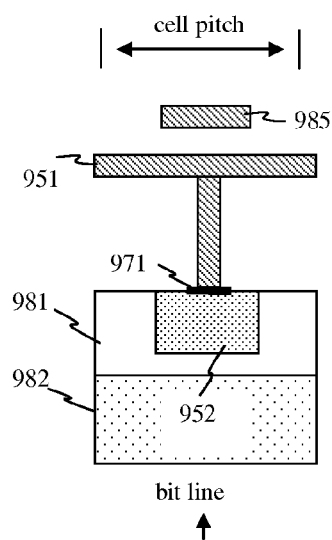

FIG. 9A outlines one embodiment of a fabrication technique on the wafer for the present invention wherein word line 951 is connected to p-type region 952 through contact region 971, p-type region 952 is attached to n-type region 953 which is connected to the first plate through conduction layer 963, a series capacitor including the first insulator 966, the floating plate 976 and the second insulator 986, which insulators can be single layer including dielectric material or multilayer including barrier layer and dielectric material wherein low-k, high-k and ferroelectric material can be used. The third plate 957 of capacitor is connected to the plate line (not shown) in order to reduce resistance. And n-type region 953 is attached to p-type region 954, p-type region 954 is attached to n-type region 955 which is vertically attached to the upper side of p-type region 954, n-type region 955 is attached to bit line 985 through contact region 975. In this embodiment, the parasitic NMOS transistor is removed because the source/drain region 955 is on the upper side of the n-type region 954, which removes the back channel effect. FIG. 9B shows bit line direction of the memory cell, where the cell is formed on the wafer.

Figure 10A:
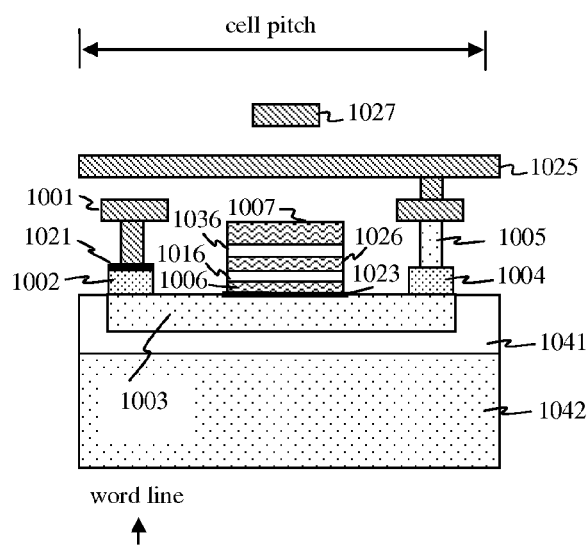
FIG. 10A illustrates the cross sectional views of one vertical embodiment for the present invention on the SOI wafer. 10A is shown from word line direction.

FIG. 10A which is shown from word line direction, outlines one embodiment of fabrication technique on the wafer 1042 with isolation layer 1041 for the present invention, wherein word line 1001 is connected to p-type region 1002 through contact region 1021, p-type region 1002 is attached to n-type region 1003 which is connected to the first plate through the buffer layer 1023, a series capacitor including the first insulator 1016, the floating plate 1026 and the second insulator 1036, which insulators can be single layer or multilayer including barrier layer and dielectric material. The third plate 1007 of capacitor is connected to the plate line 1027 outside of memory array (not shown). And n-type region 1003 is attached to p-type region 1004, p-type region 1004 is attached to n-type region 1005 which is vertically attached to the upper side of p-type region 1004, n-type region 1005 is attached to bit line 1025. In this embodiment, the parasitic NMOS transistor is removed as well. In addition, one of the alternative embodiments can be available, such that metal-semiconductor diode is used for region 1005. The leakage of this diode between p-type 1004 and metal 1005 does not matter for storing data because p-type region 1004 is floating and does not have any data, where data is stored in the storage node 1003. There is a related reference to fabricate metal semiconductor diode with CMOS process, Sankaran et al, "Schottky barrier diodes for millimeter wave detection in a foundry CMOS process", IEEE Electron Device Letters, Vol. 26, No. 7, pp 492-494, July 2005. Thus, the present invention can use various type of metal to form metal-semiconductor diode, such as Al, Cu, Au and Pt, etc. Moreover, the diode can be formed by various types of semiconductor, such as silicon including solid-state, stretchable silicon and amorphous silicon, germanium, GaAs, SiGe and others, as long as reverse bias leakage is controllable.

Figure 10B:
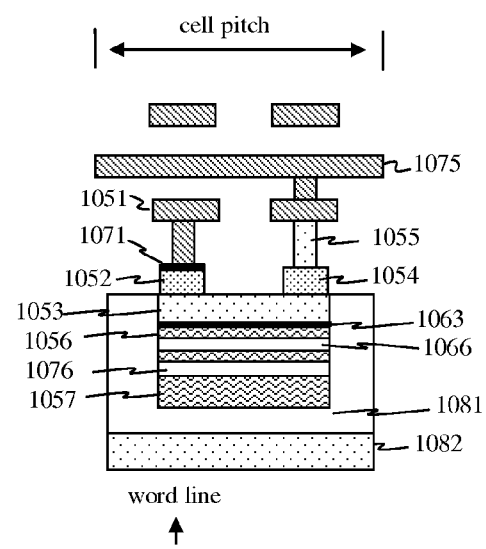
FIG. 10B illustrates the cross sectional views of one vertical embodiment for the present invention on the bulk wafer. 10B is shown from word line direction.

In FIG. 10B, one embodiment is illustrated, wherein the capacitor is formed in the bottom of the diode. Word line 1051 is connected to p-type region 1052 through contact region 1071, p-type region 1052 is attached to n-type region 1053 which is connected to the first plate through the buffer layer 1063, a series capacitor including the first insulator 1066, the floating plate 1056 and the second insulator 1076, the third plate 1057 is formed on the insulator 1081. And n-type region 1053 is attached to p-type region 1054, p-type region 1054 is attached to n-type (or metal) region 1055 which is vertically attached to the upper side of p-type region 1054, n-type region 1055 is attached to bit line 1075. This memory can reduce cell area dramatically, and can be formed on the bulk and SOI wafer with isolation layer 1081 on the wafer 1082 which is shown from the word line direction.

FIG. 11A outlines one embodiment of a fabrication technique to reduce cell area on the bulk or SOI wafer, where the third plate 1157 is placed in the bottom, word line 1151 is connected to p-type region 1152 through contact region 1171, p-type region 1152 is attached to the upper side of the n-type region 1153, and n-type region 1153 is attached to the upper side of the first plate 1156. A series capacitor is consisted of the first insulator 1166, the floating plate 1176, the second insulator 1186 and the third plate 1157, where insulators can be single layer or multilayer including barrier layer and dielectric material which can be low-k, high-k and ferroelectric material. The p-type region 1154 is attached to the upper side of the n-type region 1153, and the n-type region 1155 in FIG. 11B is attached to the upper side of the p-type region 1154. The n-type region 1155 is connected to bit line 1175. Alternatively, the region 1155 can be metal to form metal-semiconductor diode. The memory cell is isolated from the well or substrate region 1182 by insulator 1181. And FIG. 11B shows bit line direction of the memory cell where all the layers are the same as those of word line direction as shown FIG. 11A.

FIG. 12A outlines fully vertical embodiment of a fabrication technique to reduce cell area on the bulk or SOI wafer, where p-type region 1202 is shunted to metal shunting line 1201 outside of array area (not shown), p-type region 1202 is attached to n-type region 1203, the plate 1207 is partially surrounded by n-type region 2003 which can make a series capacitor including the first capacitor which is consisted of the first plate 1203 (also storage node 1203), the floating plate 1216, the first insulator 1206 is between the first plate 1203 and the floating plate 1216, and the second capacitor which is formed by the second insulator 1217 between the floating plate 1216 and the third plate 1207, n-type region 1203 is attached to p-type region 1204, p-type region 1204 is attached to n-type region which is bit line 1205 in the bottom. Bit line can be shunted by metal line outside of cell area (not shown) and is isolated from bulk or substrate 1242 by the insulator 1241. FIG. 12A shows the cross sectional view seen from word line direction, and FIG. 12B shows the cross sectional view seen from bit line direction.

FIG. 12C illustrates stacked type of embodiment, wherein two vertical cells are stacked on the wafer. Bit line 1255 is shared by two memory cells. In the upper memory cell, p-type region first terminal 1251 is attached to n-type region 1253. N-type storage node 1253 couples series capacitor including the first capacitor which is consisted of the first plate 1253 (also storage node 1253), the floating plate 1266, the first insulator 1256 is between the first plate 1203 and the floating plate 1266, and the second capacitor which is formed by the second insulator 1267 between the floating plate 1266 and the third plate 1257. P-type third terminal 1254 is attached to n-type storage node 1253, and attached to n-type 1255 which serves as bit line. In the lower memory cell, p-type region 1284 is attached to bit line 1255, the storage node 1283 fully surrounds the series capacitor, and n-type storage node 1283 is attached to p-type region 1281 which serves as word line, which forms the lower memory cell. The lower cell is mirrored from the upper memory cell. FIG. 12C shows the cross sectional view seen from word line direction. This vertically stacked memory cell can reduce area dramatically. In particular, the diode can use LTPS (Low Temperature Polysilicon), as published, U.S. Pat. Nos. 5,395,804, and 6,852,577, and 6,951,793. LTPS has been developed for the low temperature process (500 Celsius or lower) on the glass in order to apply the display panel, according to the prior arts. Generally, polysilicon diode can flow less current than single crystal silicon diode, but the polysilicon diode can flow more current than MOS transistor, because the diode can flow the current through the whole junction while the MOS transistor can flow the current through the shallow inversion layer by the gate control. In the present invention, LTPS-based diode is useful to stack the diode-based memory cells with no very thin oxide layer, because the memory cell does not include MOS transistor. The insulator for the capacitor may be thicker than that of MOS transistor. For example, ferroelectric capacitor can provide more capacitance with slightly thick layer. During polysilicon process, the MOS transistor in the control circuit and routing metal are less degraded.

While the description here has been given for configuring the memory circuit and structure, alternative embodiments would work equally well with reverse connection such that first terminal is n-type and serves as word line, second terminal is p-type and serves as storage node, third terminal is n-type and floating, and fourth terminal is p-type and serves as bit line. Word line and bit line will swing from high level to ground level to read and write, and return to high level. The plate line will swing from ground level to high level, and return to ground level.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
memory cell, wherein a series capacitor stores data and a diode controls to store data "1" or "0"; and the series capacitor as a storage device, wherein includes the first capacitor which is formed by the first insulator between the first plate and the floating plate which serves as the second plate, the second capacitor which is formed by the second insulator between the floating plate and the third plate, and a plate line is connected to the third plate of the capacitor, and the series capacitor only couples to the second terminal of the diode, while the series capacitor has no coupling or overlapping region to first, third and fourth terminal of the diode; and the diode as an access device, wherein includes four terminals, the first terminal is p-type and connected to a word line, the second terminal is n-type and serves as a storage node which is connected to the first plate of the series capacitor, the third terminal is p-type and floating, and the fourth terminal is n-type and connected to a bit line; and
read circuits, wherein include three elements, such as the diode, a current mirror and a latch device; and the diode also serves as a sense amplifier, wherein the diode generates binary data "1" (on) or "0" (off), depending on the voltage of the storage node; and the current mirror includes a pull-down device which is connected to the bit line and a current repeater whose gate is connected to the gate of pull-down device; and the latch device is connected to the drain of the current repeater and holds the read data from the memory cell; to read data "1", the word line is asserted, and establishes forward bias from the word line to the storage node (second terminal), by the forward bias the floating node (third terminal) is pulled up near the word line voltage, thus the diode sets up a current path from the word line to the pull-down device which is connected to the bit line, when the storage node stores a voltage, near the word line voltage minus built-in voltage of the diode, and then the current repeater changes the storage node of the latch device and holds the state; to read data "0", the word line is asserted, and establishes reverse bias from the word line to the storage node (second terminal), thus the diode is remained in turn-off state, when the storage node stores higher voltage than that of the word line, and the current repeater does not change the storage node of the latch device with turn-off state of the diode.

2. The memory device of claim 1, wherein the first terminal is n-type, the second terminal is p-type, the third terminal is n-type, and the fourth terminal is p-type; and the signal polarities are also reversed.

3. The memory device of claim 1 or 2, wherein the insulator of the series capacitor includes ordinary insulator, such as silicon dioxide, silicon nitride, $Ta_2O_5$, $TiO_2$, $Al_2O_3$, $TiN/HfO_2/TiN(TIT)$, and Ru/Insulator/TiN(RIT).

4. The memory device of claim 1 or 2, wherein the insulator of the series capacitor includes ferroelectric dielectric, such as lead zirconate titanate (PZT), lead lanthanum zirconium titanate (PLZT), barium strontium titanate (BST), and strontium bismuth tantalate (SBT).

5. The memory device of claim 1 or 2, wherein the doping concentration of the diode is lower than that of source/drain of the MOS transistor of the control circuit.

6. The memory device of claim 1 or 2, wherein the diode is formed from silicon including solid-state, amorphous, stretchable silicon, germanium or compound semiconductor.

7. The memory device of claim 1 or 2, wherein the fourth terminal of the diode uses metal to form metal-semiconductor diode.

8. The memory device of claim 1 or 2, wherein the word line is repeatedly connected to metal shunting lines outside of memory array, in order to reduce sheet resistance.

9. The memory device of claim 1 or 2, wherein at least one of the terminals is attached to adjacent terminal vertically.

10. The memory device of claim 1 or 2, wherein the word line is connected to the upper side of the first terminal through contact layer, the first terminal is attached to the upper side of the second terminal, the second terminal fully or partially surrounds plate to form capacitor with insulator, and the second terminal is attached to the upper side of the third terminal, the third terminal is attached to the upper side of the fourth terminal.

11. The memory device of claim 1 or 2, wherein two memory cells are stacked, share fourth terminal, and each memory cell is mirrored.

12. The memory device of claim 1, wherein the memory cell is formed on the bulk of the wafer.

13. The memory device of claim 1, wherein the memory cell is formed on the SOI wafer.

14. Content addressable memory, comprising:
memory cell wherein includes series capacitor and diode; and the series capacitor as a storage device, wherein includes the first capacitor which is formed by the first insulator between the first plate and the floating plate which serves as the second plate, and the second capacitor which is formed by the second insulator between the floating plate and the third plate; and the diode as an access device, wherein includes four terminals, the first terminal is connected to a word line, the second terminal is connected to the first plate of the capacitor and stores data, the third terminal is floating, and the fourth terminal is connected to a bit line; and
at least one compare circuit coupled among the memory cell and at least one match line to receive first and second signal sets and affect a logical state of the match line in response to a predetermined logical relationship between the first and second signal sets, the compare circuit including a first transistor set and a second transistor set, wherein the first signal set couples to control a conduction state of the first transistor set and the second signal set couples to control a conduction state of the second transistor set, wherein the first signal set includes stored data and the second signal set includes compared.

* * * * *